United States Patent [19]
Johnson et al.

[11] Patent Number: 5,365,237
[45] Date of Patent: Nov. 15, 1994

[54] MICROWAVE CAMERA

[75] Inventors: Paul A. Johnson, El Cajon; Ri-Chee Chou; Chris A. Martin, both of San Diego; Britt Spivey, Encinitas; John Lovberg, San Diego, all of Calif.

[73] Assignee: Thermo Trex Corporation, San Diego, Calif.

[21] Appl. No.: 63,268

[22] Filed: May 13, 1993

[51] Int. Cl.$^5$ .............................................. G01S 3/02
[52] U.S. Cl. .................... 342/179; 342/351; 342/54
[58] Field of Search .................... 342/351, 179, 54

[56] References Cited

U.S. PATENT DOCUMENTS

| | | |
|---|---|---|
| 4,464,624 | 8/1984 | Osterwalder . |
| 4,633,170 | 12/1986 | Burns . |
| 4,871,232 | 10/1989 | Grinsberg . |
| 5,041,778 | 8/1991 | Loualiche . |
| 5,121,124 | 6/1992 | Spivey . |

Primary Examiner—Mark Hellner
Attorney, Agent, or Firm—John R. Ross

[57] ABSTRACT

A camera system in which microwave radiation from objects in a field-of-view is collected by an antenna having beam directions which are a function of the beam frequency. The collected radiation is used to modulate an optical beam to impose upon the beam spectral components which are functions of the frequencies of the microwave radiation. The modulated beam is then analyzed by an optical spectrum analyzer to produce an image of objects in the field of view. In a simple embodiment of the invention a one dimensional image is produced. This one dimensional image can be converted to a two dimensional image by panning the camera system or mounting the camera on a moving platform. In this preferred embodiment the spectrum analyzer comprises an angle-frequency filter (preferably an etalon). The portion of the modulated beam passing through the etalon is directed in a number of directions, the directions being a function of the spectral components of the modulated beam. The light passing through the etalon is focused on the aperture of a television camera to produce a one dimensional image. In another preferred embodiment an array of antennas and a corresponding number of optical modulators are used to produce a two dimensional real time image. The camera is capable of imaging objects through media such as wooden walls or fog, which are transparent to microwaves, but are opaque to visible light.

16 Claims, 13 Drawing Sheets

MICROWAVE CAMERA

The invention relates to cameras and in particular to microwave cameras.

BACKGROUND OF THE INVENTION

A patent (U.S. Pat. No. 5,121,124) on a microwave camera system was issued on Jun. 9, 1992 to two of the present inventors and two others. That patent disclosed a camera system in which a microwave radiation from objects in a field-of-view is collected by an antenna having a beam direction which is a function of the beam frequency. The collected radiation is converted into electronic acoustic signals which set up a diffraction pattern in a Bragg cell, to diffract a laser beam which is focused on a television camera, to produce a one dimensional image of the field-of-view. The antenna can be scanned to produce a two dimensional image. In another embodiment an array of antennas and a multi-channel Bragg cell is used to produce a two dimensional real time image. The camera is capable of imaging objects through media such as wooden walls which are transparent to microwaves but are opaque to visible light. Electro-optic modulators and optical spectrum analyzer devices are known.

SUMMARY OF THE INVENTION

The present invention provides a camera system in which microwave radiation from objects in a field-of-view is collected by an antenna having beam directions which are a function of the beam frequency. The collected radiation is used to modulate an optical beam to impose upon the beam spectral components which are functions of the frequencies of the microwave radiation. The modulated beam is then analyzed by an optical spectrum analyzer to produce an image of objects in the field of view. In a simple embodiment of the invention a one dimensional image is produced. This one dimensional image can be converted to a two dimensional image by panning the camera system or mounting the camera on a moving platform. In this preferred embodiment the spectrum analyzer comprises an angle-frequency filter (preferably an etalon). The portion of the modulated beam passing through the etalon is directed in a number of directions, the directions being a function of the spectral components of the modulated beam. The light passing through the etalon is focused on the aperture of a television camera to produce a one dimensional image. In another preferred embodiment an array of antennas and a corresponding number of optical modulators are used to produce a two dimensional real time image. The camera is capable of imaging objects through media such as wooden walls or fog, which are transparent to microwaves, but are opaque to visible light.

The improvement of the present invention over the one disclosed in U.S. Pat. No. 5,121,124 is that in the present invention the inventors have discovered a technique for modulating the laser beam electro-optically rather than acousto-optically. This provides for potentially much greater field of view and the system could be much less expensive to build.

DETAILED DESCRIPTION OF THE EMBODIMENTS

The present invention can be described by reference to the figures.

In this specification and in the appended claims the term "microwave radiation" is intended to cover electromagnetic radiation within a frequency range of about $10^9$ Hz to about $10^{12}$ Hz.

PROTOTYPE

A demonstration unit is described in FIGS. 1A, 1B, 2A, 2B and 3.

The Antenna

A one meter long microwave antenna 2 is mounted at the focus of a parabolic reflector 4 which is mounted on a table 5 rotatable around the focus of reflector 4. Parabolic reflector 4 limits the horizontal field of view of microwave antenna 2 to about 1°. Cut in the face (side 6) of antenna 2 are 112 slots for collecting microwave radiation. The spacing of these slots are chosen to permit the antenna to detect microwave radiation in the range of approximately 17-21 GHz. The slots are described in Table. 1.

TABLE 1

| Slot Number | θ |
|---|---|
| 1–10 | 2.5° |
| 11–20 | 5° |
| 21–30 | 7° |
| 31–40 | 8.4° |
| 41–50 | 9.5° |
| 51–60 | 10.5° |
| 61–70 | 11° |
| 71–80 | 11° |
| 81–90 | 11.5° |
| 91–100 | 11.5° |
| 101–106 | 12° |
| 106–112 | 13° |

Electronics

Figure 3:
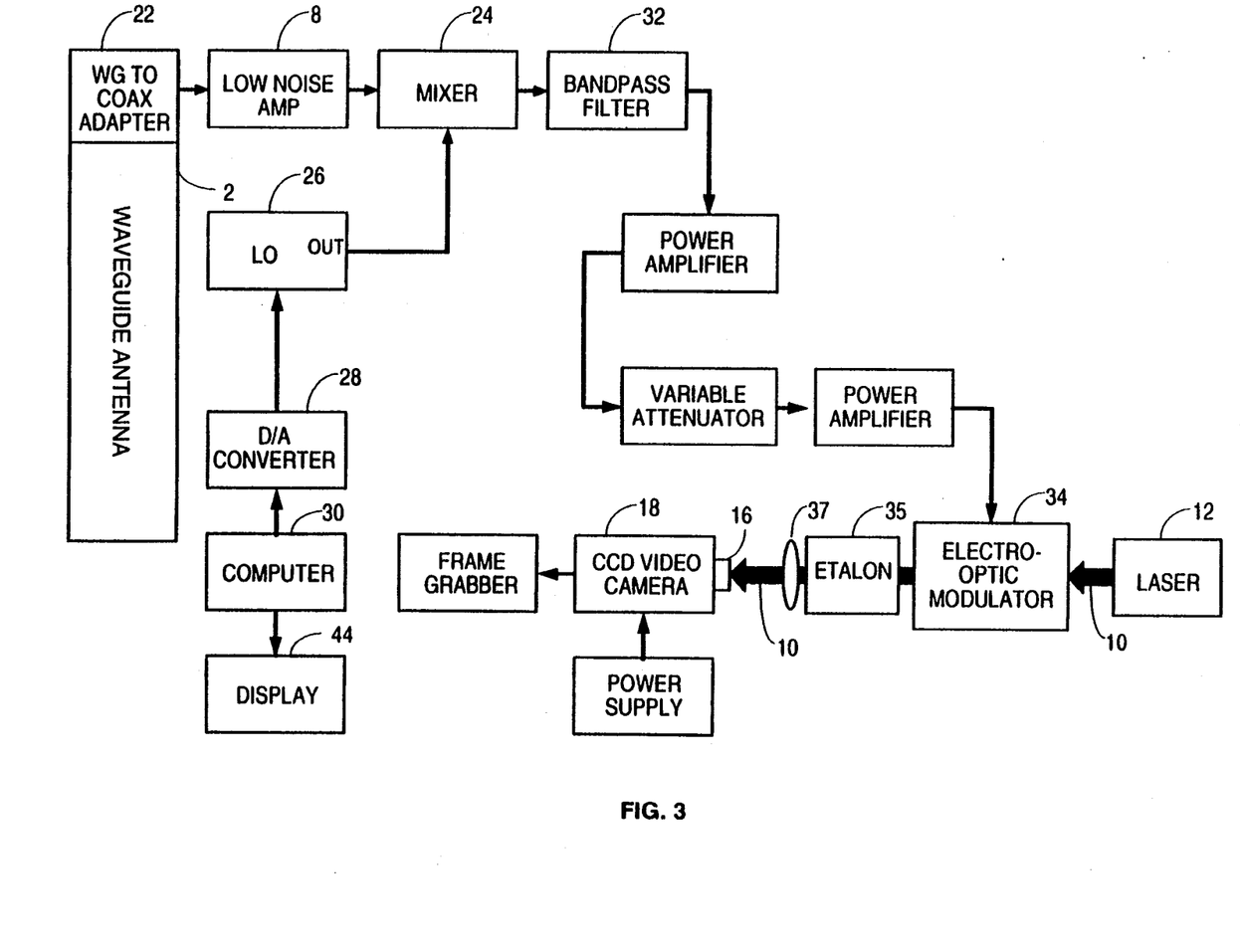
FIG. 3 is a block diagram of a preferred embodiment of the present invention.

The waveguide antenna used was constructed of type WR51 waveguide and supplied by Vantage Corporation of San Diego, Calif. As indicated in FIG. 3, output from the antenna goes to coax adapter 22 which is connected by coax cable to low noise amplifier 8 made by MITEQ Corporation which provides a 15 dB gain for frequencies within the 17–21 GHz range. The output from amplifier 8 goes to mixer 24 where it is mixed with the output of variable frequency generator which we will refer to as local oscillator 26.

Figure 1A:
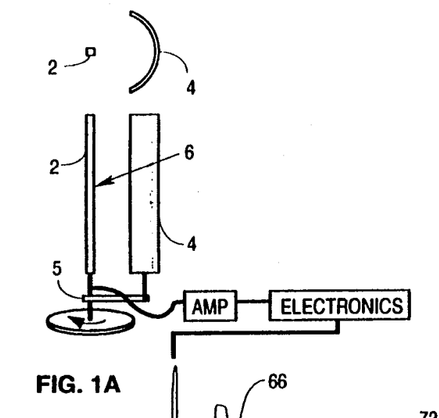
FIGS. 1A and 1B are two views of a preferred embodiment of the present invention.
Figure 1B:
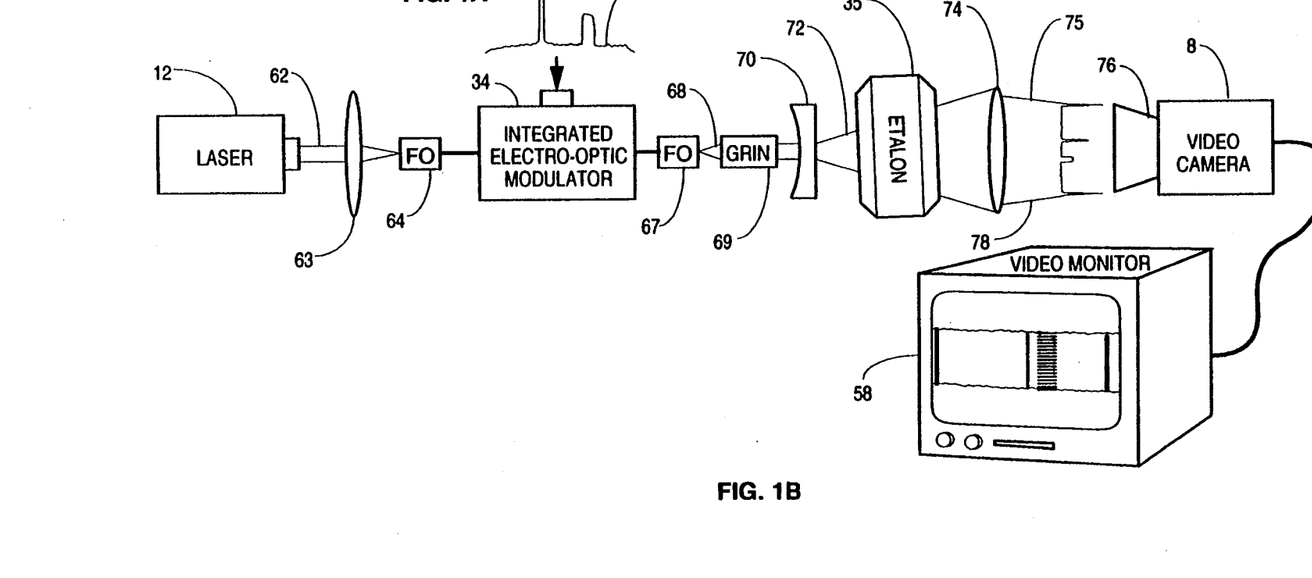
Figure 2A:
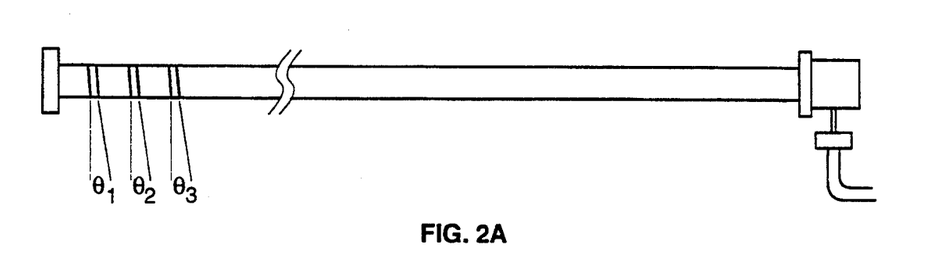
FIGS. 2A and 2B are two views of a microwave waveguide antenna.
Figure 2B:
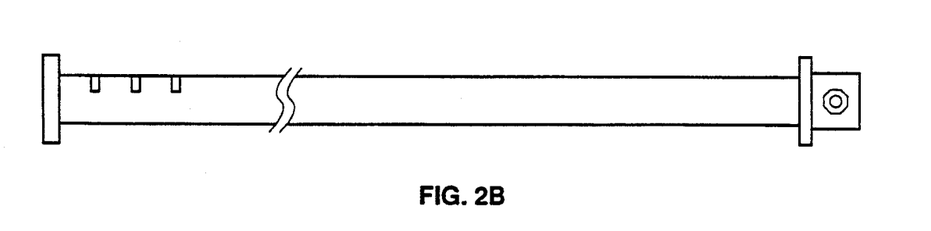

Thus, when frequency generator 26 is producing a 15 GHz LO signal and this LO signal is mixed with the output of signal amplifier 8, a 2–6 GHz difference signal will be produced. This 2–6 GHz signal is filtered to essentially eliminate frequencies outside the 2 GHz band and amplified further as shown in FIG. 3, and this further amplified signal 66 (as shown in FIG. 1B) is used to drive electro-optic modulator 34 made by United Technology Photonics, East Hartford. Conn.

Figure 4:
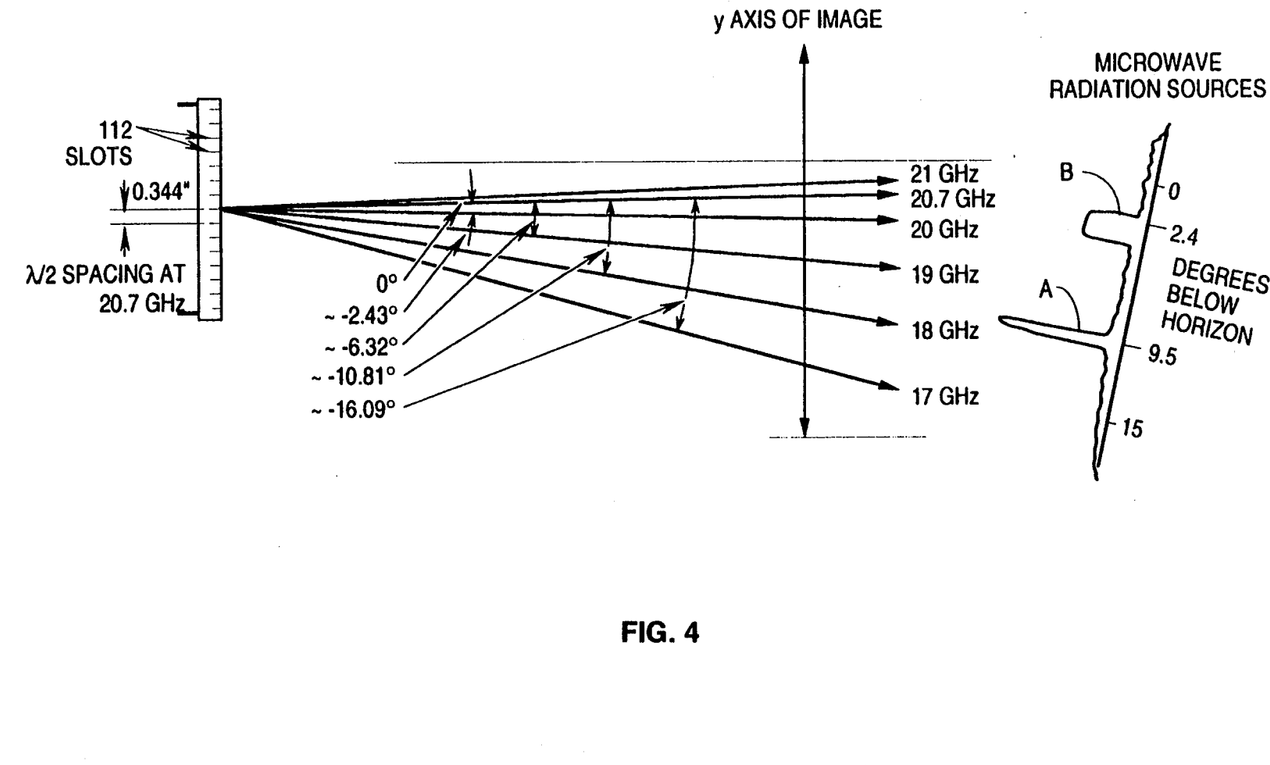
FIG. 4 is a drawing showing the relationship between beam angle and microwave frequency for the antenna shown in FIGS. 2A and 2B.

For example, we will assume that within the field of view of antenna 2 as shown in FIG. 4, there exists a bright narrow (in the vertical direction) broad spectrum source A located at an angle of 9.51° below the horizontal (as shown in FIG. 4) and a less bright, wider (in the vertical direction) broad spectrum source B located at an angle of 2.41° below the horizontal. These two example sources are shown at the right side of FIG. 4.

The Laser

Figure 6:
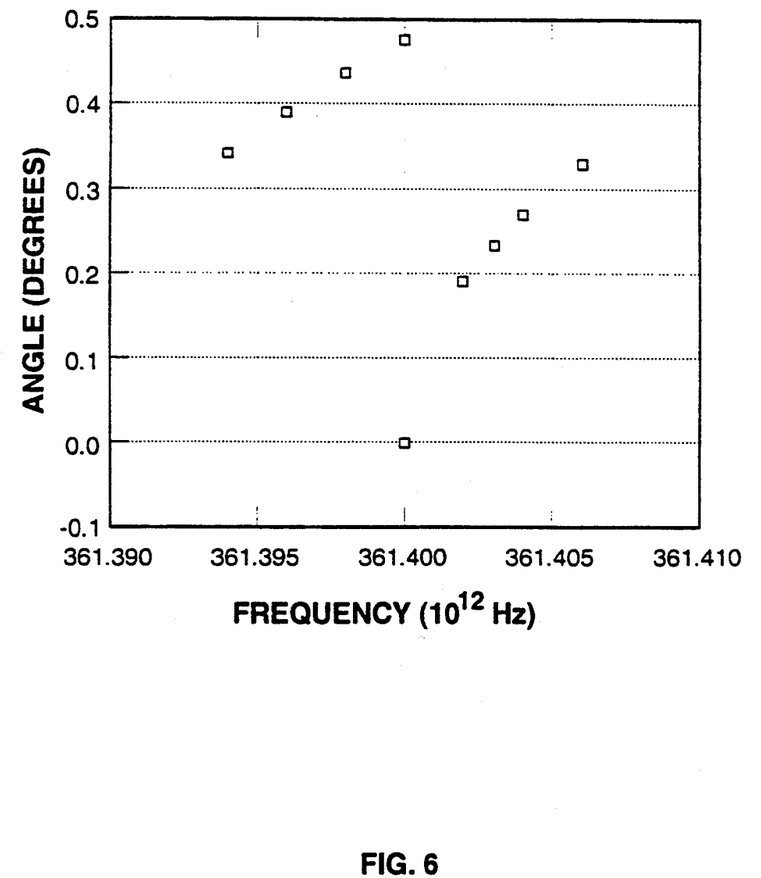
FIG. 6 is a chart showing transmission through an etalon and in a preferred embodiment.
Figure 6A:
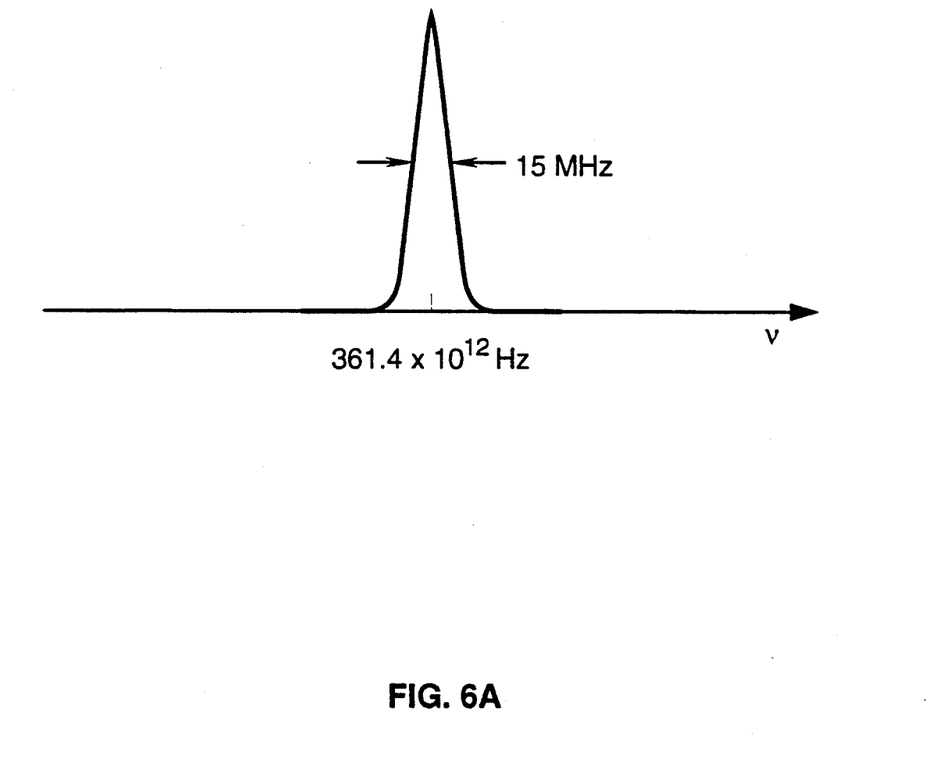
FIG. 6A shows the spectrum of a laser beam used in a preferred embodiment.

As shown in FIG. 1B., a narrowband continuous wave laser beam 62 is produced by diode laser 12 tuned to $361.400 \times 10^{12}$ Hz$\pm 10 \times 10^6$ Hz. FIG. 6A shows the spectrum of the laser beam.

The preferred laser system 12 in this embodiment is a laser system supplied as part number 06 DLC 507 by Melles Griot Corporation, Irvine, Calif. which uses laser diode SDL 5400 produced by Spectra Diode Labs, San Jose, Calif.

The Electro-Optic Modulator

Figure 6B:
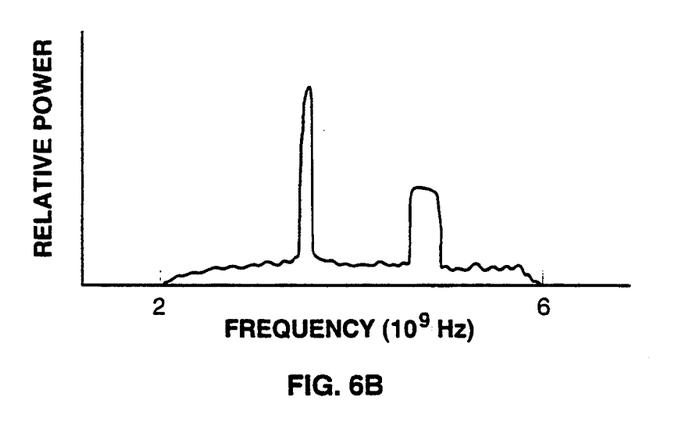
FIG. 6B shows a typical spectrum from the microwave antenna.

Beam 62 is focused into fiber optic 64 by lens system 63 and the laser light is fed by fiber optic cable through electro-optic modulator 34. In modulator 34 signal 66 to be analyzed is mixed with laser beam 62. FIG. 6B shows the spectrum of such a typical signal from microwave antenna 6 (as modified and amplified as described above) and we will use this spectrum as an example in this description. Signal 66 contains frequency components ranging between $2 \times 10^9$ Hz to $6 \times 10^9$ Hz as shown in FIG. 6B. This example frequency is shown to have a narrow peak centered at $3.5 \times 10^9$ corresponding to source A and a broader peak centered at $5 \times 10^9$ Hz corresponding to source B.

Figure 6C:
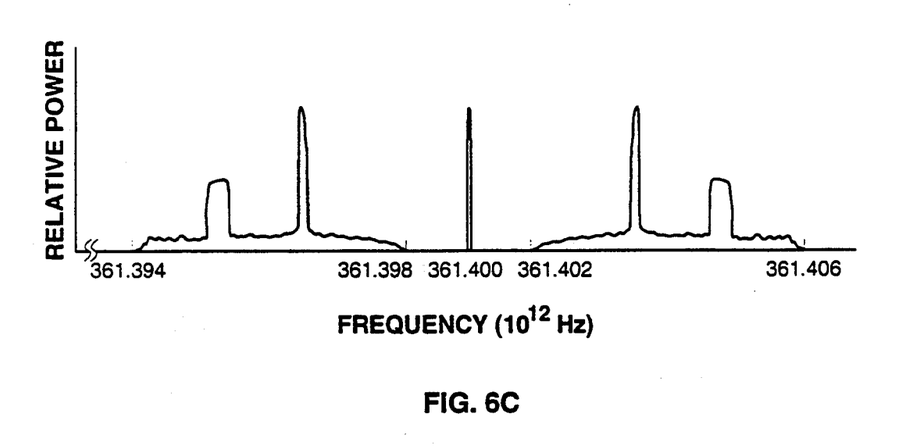
FIG. 6C shows a typical spectrum of a laser beam of FIG. 6A modulated by the signal shown in FIG. 6B.

The modulated beam is shown in FIG. 1B exiting fiber optic 67 as beam 68. It contains the carrier frequency at $361.400 \times 10^{12}$ Hz; and it also contains upper and lower side bands at frequencies equal to the sum and difference of the carrier frequency and the modulating signal frequencies. Thus, the spectrum of the modulated beam 68 has frequency components ranging from $361.394 \times 10^{12}$ Hz to $361.406 \times 10^{12}$ Hz. The optical spectrum of modulated beam 68 is graphically portrayed in FIG. 6C. The center of narrow $3.5 \times 10^9$ Hz peaks appears at $361.3965 \times 10^{12}$ Hz and $361.4035 \times 10^{12}$ Hz, and the center of $5 \times 10^9$ Hz broad peak appears at $361.395 \times 10^{12}$ Hz find $361.405 \times 10^{12}$ Hz in the modulated beam. Beam 68 is collimated by GRIN (graded index) rod lens 69 and directed to cylindrical plano-concave lens 70 which converts beam 68 into a fan shaped beam 72. Beam 72 consists of a plane of rays radiating at all angles between 0.36° and −0.36° with respect to optical axis of beam 72. Beam 72 thus produces a thin rectangular pattern on the aperture of etalon 35.

Figure 5:
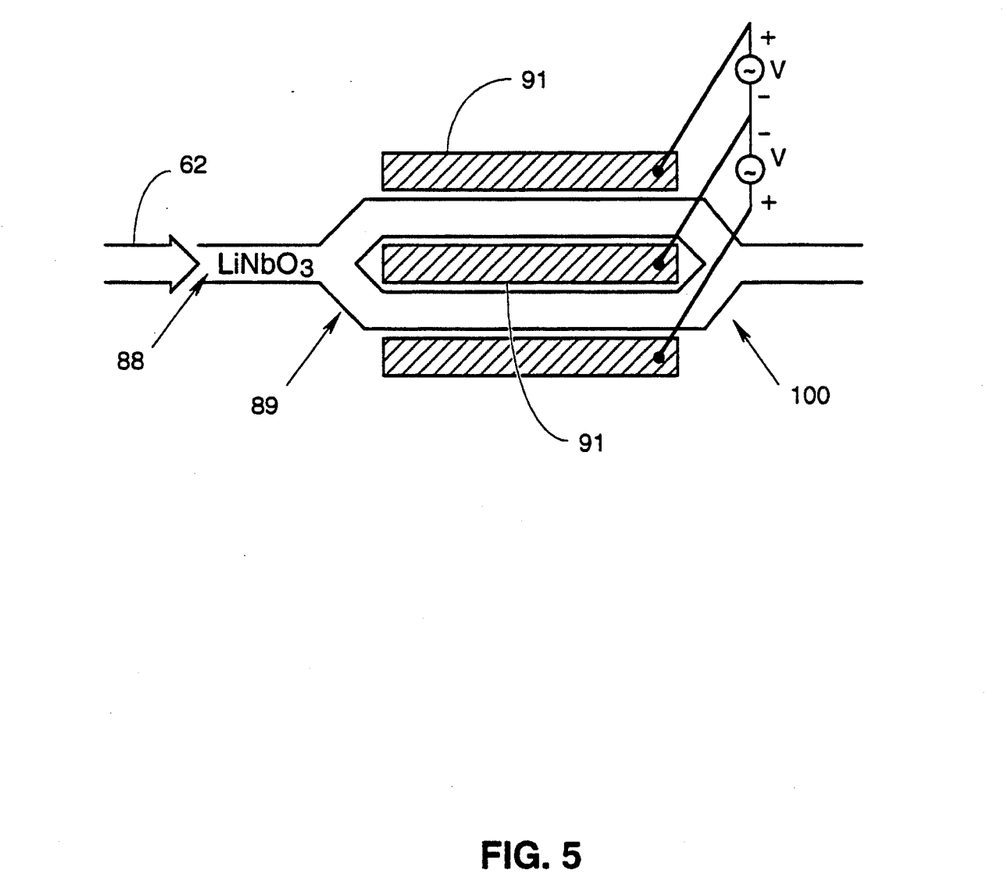
FIG. 5 is a drawing showing elements for an electro-optic modulator.

The electro-optic modulator 34 used in the preferred embodiment is an integrated waveguide Mach-Zender type modulator. The basic structure of such modulators is shown in FIG. 5. An incoming optical beam 62 in injected into a Lithium Niobate (LiNbO$_3$) optical waveguide 88. The beam is separated equally in a "waveguide Y" 89 and finally recombined at 100. An applied voltage to the electrodes 91 creates an electric field on both legs of the "y" but the field in one leg is opposite to that of the other leg. The fields change the refractive index of the LiNbO$_3$ waveguide linearly with the intensity of the electric field intensity in accordance with the Pockels effect. This changes the effective optical path length of the different arms of the "Y" and results in phase shifts of the optical signals in each arm. If the phase shift in both arms is identical, the optical beams recombine constructively, and all the input power appears at the output minus the waveguide and "Y" losses. When the applied voltage produces a net phase-shift difference between the two arms of $\pi$ radians, the modes in the two waveguides are 180° out of phase and excite an antisymmetric mode in the output guide. The output guide is a single mode guide that cannot sustain such a mode; the power dissipates by radiation into the substrate, and no output is produced. By varying the level of the applied voltages, the optical beams can be made to recombine with different relative phase shifts, producing a varying intensity of the output beam. This results in amplitude modulation of the input optical beam by the applied voltage.

The Etalon

Figure 9:
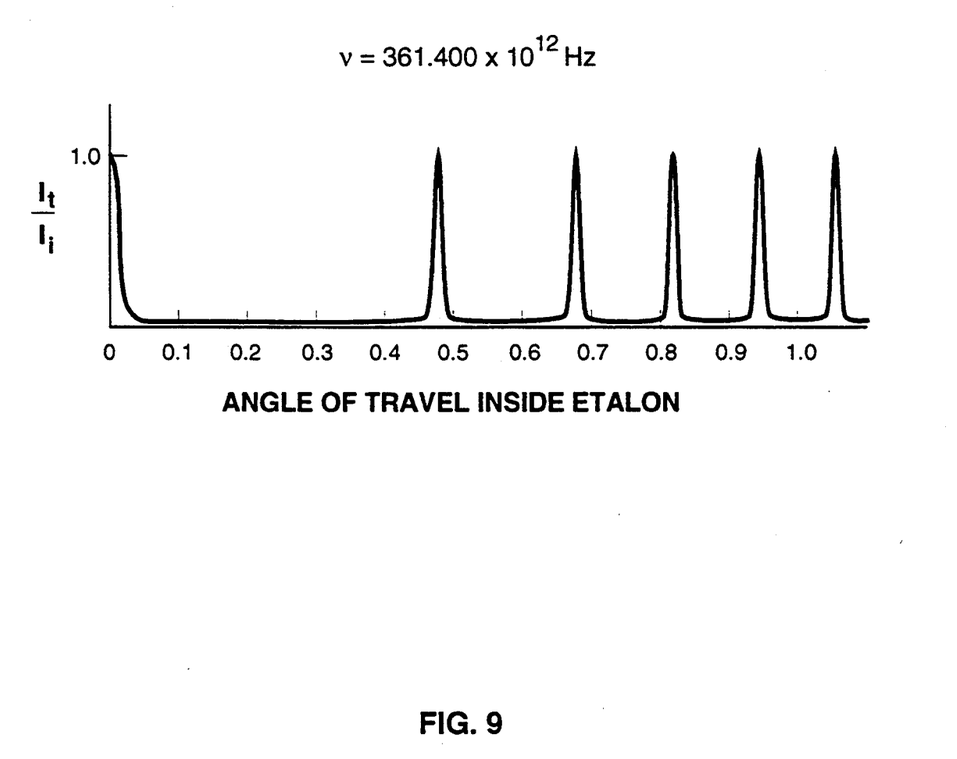
FIG. 9 shows transmission through an etalon of light at the frequency of the laser beam shown in FIG. 6A.

Etalon 35 in this preferred embodiment is a fused silica etalon (Part No. ET-25.4-8.00) UV supplied by CVI Laser of Albuquerque, N. Mex.). This etalon in this embodiment is used as an optical filter. Its filter characteristics at the carrier frequency $361.400 \times 10^{12}$ Hz (830 nm wavelength) is shown in FIG. 9. The light transmission through the etalon depends very strongly on the angle at which the light illuminates the front surface of the etalon. As shown in FIG. 1, transmission through the etalon is substantially 100% for light at the carrier frequency propagating through the etalon at very narrow angles centered at 0°, 0.477°, 0.674°, 0.825°, 0.953°, 1.066° etc. Transmission is substantially zero for carrier frequency light illuminating the etalon at all other angles within this range of angles. In our preferred embodiment the optical axis of beam 12 is adjusted to an angle of 0.357° as measured from the axis of etalon 35.

It is a characteristic of etalon 35 that any light transmitted through the etalon will exit the etalon at the same angle that it entered in the etalon. Since the axis of beam 72 is at 0.357° and beam 12 is expanding at $\pm 0.36°$, light from the beam will illuminate the etalon at all angles between 0° and 0.717°; Snells law dictates that the forward direction of light inside the etalon (n=1.5) will be at angles from 0° to 0.477°. Therefore, we do not have to be concerned with transmission of carrier frequency ($361.4 \times 10^{12}$ Hz) light transmitted at angles other than 0° and 0.477°.

The etalon is substantially reflective to carrier frequency light traveling in this etalon at angles between 0.055° and 0.475°. However, for light traveling at any angle within these ranges of illumination angles, there is one frequency near the carrier frequency which will be readily transmitted by etalon 35. This relationship between illumination angle and frequency transmitted is shown in FIG. 6. Thus, the portion of the spectrum of modulated beam 72 within the $361.4035 \times 10^{12}$ Hz narrow peak will be transmitted through etalon 35 to the extent that the beam transverses the etalon angles at or very close to 0.252°. Similarly, the broad peak centered at $361.405 \times 10_9$ Hz will be transmitted at angles at or close to 0.301°. As indicated above, all light transmitted by etalon 13 exits at the same angle as it had upon entering the etalon, which is approximately 1.5 times the angle of transmission through the etalon, due to Snells law. The carrier beam is transmitted at 0° and 0.477° as indicated above and in FIG. 6.

The functioning of the etalon as a part of our system is described above. The following is a more detailed explanation of the features of the etalon.

Figure 10A:
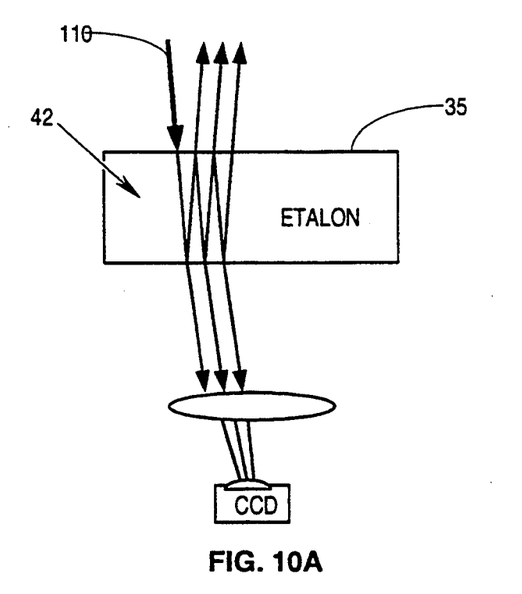
FIGS. 10A and B shows transmission through the etalon referred to above.

The etalon 35 used in the preferred embodiment is a solid piece of fused silica 8 mm thick with highly parallel faces which are highly reflective at laser frequencies in The frequency range near 830 nm. The etalon functions as an interferometric device. When an electro magnetic wave 40 (light) strikes the etalon, it will undergo many overlapping reflections between the first surface and the second surface of the glass as shown in FIG. 10A. This sets up a standing electric field wave inside the glass. The total amount of light transmitted depends upon the strength of the standing wave at the second surface of the etalon. Likewise, the total amount of light reflected depends upon the strength of the standing wave at the first surface of the etalon. The electric field strength is determined by adding all the electric fields of the multiple internal reflections. As the light is coherent, these fields may add together (constructive interference) or cancel each other out (destructive interference). The interference will be either constructive or destructive depending upon the frequency of light and the angle at which the light travels inside the etalon.

As stated above, the etalon is 8 mm thick. Light striking the etalon at an angle of 0.715° will travel through the etalon to the opposite surface at an angle of 0.477°. Thus, the round trip distance traveled will be 16,000,554.5 nm. The wavelength of our carrier frequency is 553.4 nm inside the etalon, therefore, at this angle the light will travel an integral number of wavelengths (i.e. 28913) and the light on each reflection will arrive at the exit surface of the etalon in phase, with the result that essentially 100% of the light will be transmitted. For light at the carrier frequency illuminating the etalon at angles between about 0.082° and 1.00° (excluding a very narrow angle range around 0.715°), the light from multiple reflections will not be in phase at the exit surface of the etalon and essentially zero light will be transmitted. (A good discussion of this type of multiple beam interference including a mathematical analysis is provided in the classic text, Optics, by Hecht and Zajac, Section 9.7, Adison-Wesley Publishing co., Menlo Park, Calif.) As described above, the modulated beam contains frequencies (representing the modulating signal) which are readily transmitted at angles within the above range.

The Video Camera

Referring back to FIG. 1B, the portion of beam 72 transmitted through etalon 35 is focused by imaging lens 74. Pixel array 76 of video camera 18 is placed in a portion of the image plane so as to permit illumination of the array by the portion of light transmitted through etalon 35 at angles between 0° and 0.477°. As a result, the carrier frequency 80 centered at $361.400 \times 10^{12}$ Hz will be imaged at both edges of monitor 58 corresponding to angles 0° and 0.477°. The narrowband peak corresponding to source A (shown in FIG. 4) centered at $361.4035 \times 10^{12}$ Hz is shown as a bright strip at 81 corresponding to angle 0.252° and the broad peak corresponding to source B centered at $361.405 \times 10^{12}$ Hz is shown as a dimmer wider strip at 82 corresponding to angle 0.301° on video monitor.

Therefore, when a source of microwave radiation generates signals that are received by antenna 2, and these signals are used to modulate laser beam 62 as described above, laser light of slightly different colors from laser 12 will be detected by video camera 18 and the intensities of the slightly different colors of light will be generally proportional to the intensities of the different frequencies of the microwave radiation entering antenna 2.

Vertical Steering

The basic principal on which this invention is founded is that microwave antenna 2 will detect slightly different microwave frequencies at slightly different angles. The relationship is further explained as follows:

The spacing between the slots of antenna 2 are 0.344 inches (0.874 cm). This corresponds to 1 wavelength of 20.7 GHz microwave radiation within antenna 2. The wavelength within the antenna is given by the following formula:

$$\lambda_g = \lambda \left[ \epsilon - \left( \frac{\lambda}{\lambda_c} \right)^2 \right]^{-1}$$

where:
$\lambda_g$ is the wavelength within the antenna
$\lambda$ is the wavelength in space for 20.7 GHz microwave radiation (which is 0.5693 inches)
$\lambda_c$ is the cutoff frequency for this antenna (which is 1.01833 inches)
$\epsilon$ is the dielectric constant for air (which is 1.00064).

Therefore, 20.7 GHz microwave radiation entering the slots from broadside will constructively interfere in such a way as to produce standing microwave signal in the antenna which is transmitted out of antenna 2 through coaxial adapter 22. Microwave radiation at 20.7 GHz entering the slots from small angles other than broadside will not constructively interfere in the wave guide. However, there will be interference for slightly different frequencies at various angles other than broadside. For the antenna shown in FIGS. 1A, 1B, 2A and 2B the relationship between beam angle and the frequency which will produce constructive interference is shown in FIG. 4.

As indicated above, in order to determine the intensity of the broadside radiation in the range of 20.7 GHz, the signal from the antenna is mixed with the local oscillator (LO) signal, which is 15 GHz, to produce a difference signal of 5.7 GHz. This 5.7 GHz signal is amplified and the amplified signal modulates the laser beam. The modulation of the laser beam causes a slight color shift in the laser light. This color shift causes the light to emerge from the etalon at a specific angle, which corresponds to the 20.7 GHz signal entering the antenna. Antenna 2 will collect 20.7 GHz microwave energy only if it is entering the antenna broadside (i.e. at approximately 0.0° [horizontal] as shown in FIG. 4). Therefore, microwave energy entering the antenna from directly broadside is represented by light exiting the etalon a specific angle. Microwave energy entering the antenna from other angles is represented by light exiting the etalon at other specific angles.

If a source of 20.7 GHz microwave radiation were to be located at say, 10.81° below broadside, radiation from the source would not constructively interfere inside antenna 2 and the antenna would not receive the signal. However, if a microwave source close to 18 GHz were located at 10.81° below the horizontal, radiation from the source would constructively interfere in the waveguide and the signal would be received by the waveguide antenna.

In order for this signal to modulate the laser light, a local oscillator of 15 GHz is provided by frequency generator 26. Mixing the signal provided by the antenna with the local oscillator produces a different signal in the range of 3 GHz (for an 18 GHz antenna signal), which is amplified and modulates the laser light. The laser light is now modulated by a 3 GHz signal as a result of an 18 GHz microwave source placed at 10.81° below horizontal in the antenna field of view. Similarly, microwave frequencies between 17 GHz and 21 GHz can be made to modulate the laser light, provided the signals originate at the appropriate elevation relative to the antenna broadside, as shown in FIG. 4.

The operation of this device as a microwave camera is based on the assumption that objects of interest will produce microwave radiation more or less uniformly as a function of frequency over its surface area of interest in the range of 17-21 GHz. Thus, the antenna can be made to "look" in vertical directions between −16.09° and +1° by examining the frequencies between 17-21 GHz, with 17 GHz corresponding to −16.09° and 21 GHz corresponding to +1°.

Parabolic reflector 4 limits the horizontal FOV to 1°. Therefore, the instantaneous horizontal FOV is about 1° wide. Scanning in the horizontal dimension is accomplished by rotating reflector 4 about its center of focus.

Some earlier microwave imaging systems relied on a time coded output from a spectrum analyzer. None of the approaches described in this invention rely on a time coded output from the spectrum analyzer. A spatial coded spectrum analyzer output is used to derive the images.

Several different wave types may be used to create images. Some of these wave types include:
 a) Microwaves
 b) Radio waves at frequency lower than microwaves
 c) Acoustic waves
 d) Light waves An embodiment of the present invention may be constructed wherein an acoustic antenna receives acoustic energy and provides a signal to a modulator that is derived from this acoustic energy. This signal may be used to modulate the beam from laser 34 and derive an image in a manner corresponding to that described in the preferred embodiment. The different types of waves used to derive the image generally necessitate only a change in the form of scanned antenna 50 and require a different bandwidth of spectrum analyzer.

Real Time Array Camera

Figure 7:
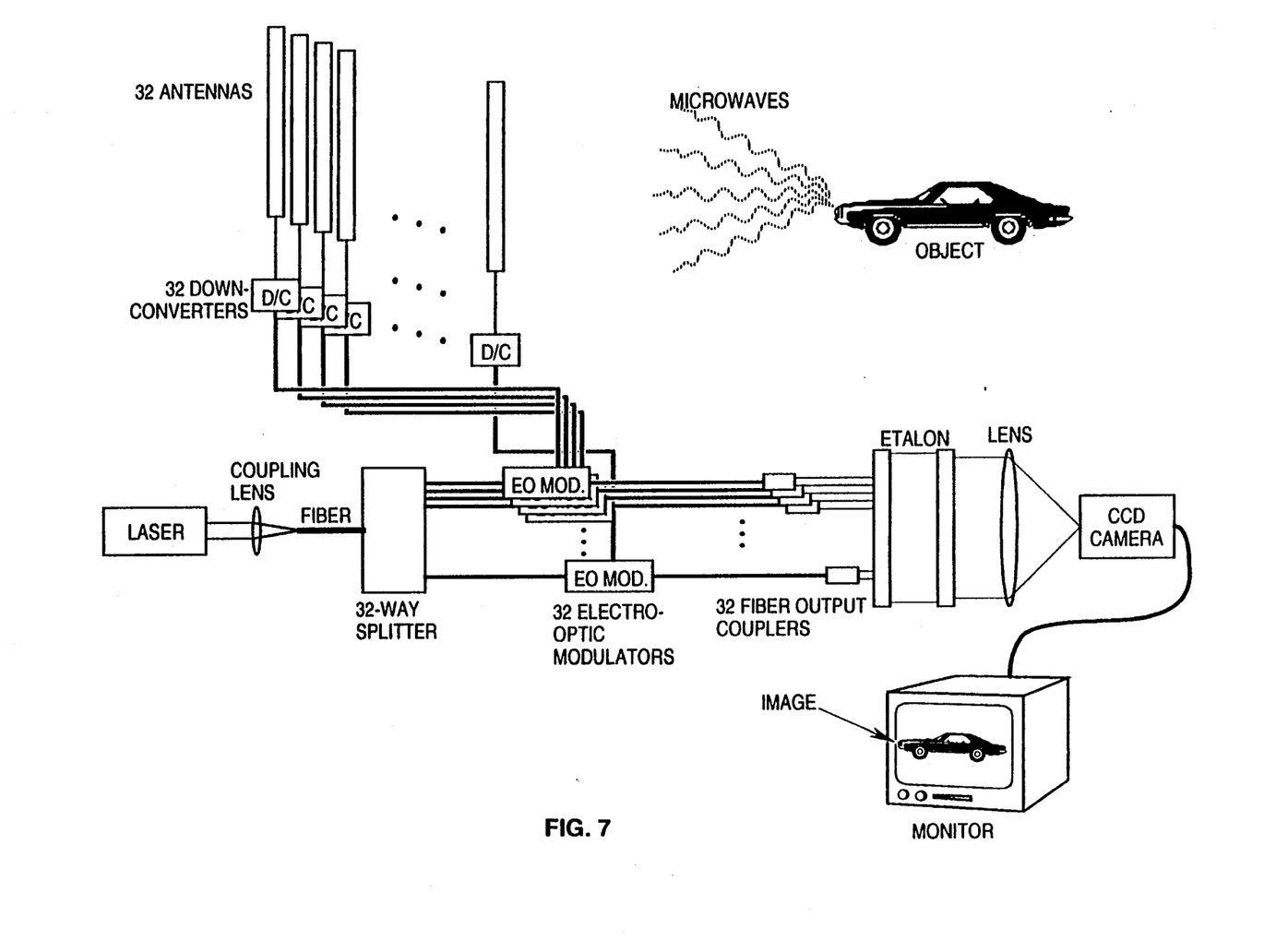
FIG. 7 shows a layout for producing real time images.
Figure 8A:
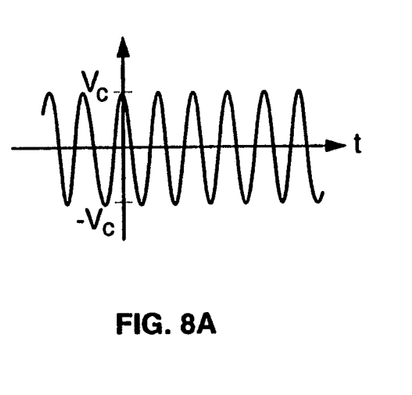
FIG. 8A, B, and C are sketches showing a laser beam, a signal beam and a modulated beam produced by modulating the laser beam with the signal beam.
Figure 8B:
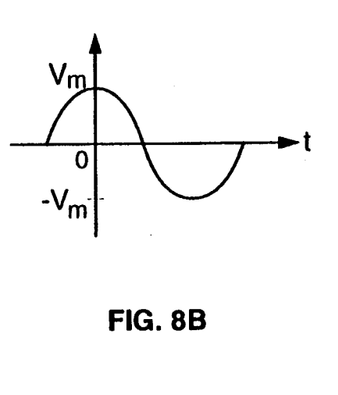
Figure 8C:
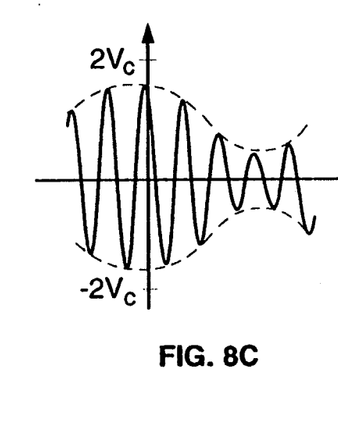

An embodiment of the present invention providing a real time two dimensional image is shown in FIG. 7. For this embodiment an array of 32 antennas is used. The signal from each of these antennas is processed as described earlier with respect to the single antenna system and resulting signals are fed into 32 electro-optic modulators, whose outputs are spaced at the same ratio as the antenna spacing. The modulated light outputs from all 32 modulators are sent to a single etalon. The etalon output is collected by an imaging lens and focused onto a video camera.

Vertical spatial resolution is produced as described above under the section entitled Electro-Optic One Dimensional Imaging. Each individual channels provides vertical image resolution exactly as does a single channel. Horizontal resolution is produced by the relative phase between the individual channels. Light from each of the individual channels emerges from the modulators and is combined. Phase differences in the modulating signals at each antenna result in phase differences in light. Combining the light with the different phases serves to steer the light horizontally much like a beam is steered by a standard phased array. The constantly varying signals on the individual channels continuously smears the combined light from the channels into the horizontal dimension of the image. Horizontal and vertical resolution are achieved simultaneously, horizontal by relative channel phase, and vertical by the frequency scanned antennas coupled to the spectrum analyzers.

Etalon Efficiency

Figure 10B:
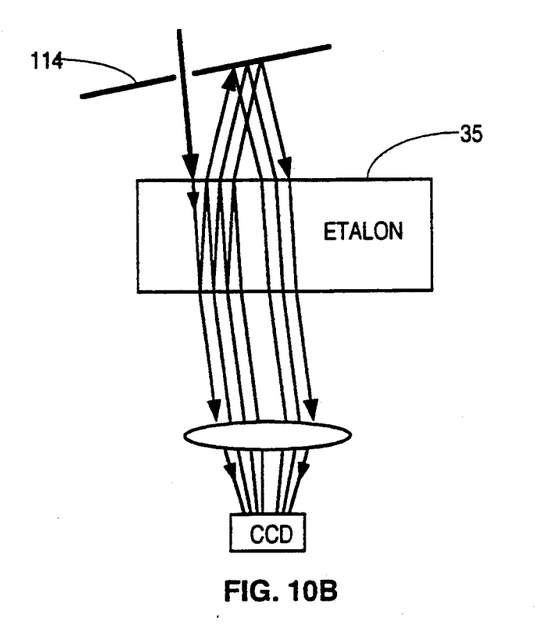

The efficiency of the etalon described in the preferred embodiments is 1/75. That is, of the light incident upon the etalon, approximately 1/75 will be transmitted. The remainder of the light is reflected away from the imaging lens. In another embodiment (a portion of which is shown in FIG. 10B) a surface 114 is used to collect light reflected from the etalon and send it back to either a separate etalon mounted at the same angle as the first etalon, or a separate area of the same etalon. The surface may be either a smooth (preferably slightly tilted) reflective surface or a diffusive surface. In either case, the light reflected from the first etalon, which still contains all the modulated frequencies of the signal to be analyzed, would be sent back at a different angle. Any light passing this time would be collected by the same imaging lens and mapped onto the camera plane according to transmission angle. This process of redirecting reflected light back into another etalon could be repeated many times with the overall result of improving the efficiency of the system.

Acoustic Imaging

The basic principals of the above described approach to microwave imaging may also be applied to acoustic imaging. An acoustic imaging system may be constructed in which an array of microphones functions as a frequency-direction dependent antennas for acoustic waves in the same way that a slotted waveguide antenna works as a frequency-detection dependent antenna for microwaves. The output for the microphones would be passed to a spectrum analyzer and display device to form the images. Such a system would function by acquiring the sound emitted or reflected from objects in the field of view (FOV). In an acoustic imaging system of this type, the spectrum to be analyzed would be of much lower frequency and bandwidth than in the microwave imaging system. The acoustic signals would contain frequencies of several megahertz (max), and frequency resolution of several Hertz would be needed to get a high pixel resolution in the image. The spectrum analyzer function for an acoustic imaging system would therefore best be performed by a digital Fourier transform in a computer, rather than by an electro-optic or acousto-optic spectrum analyzer, since the frequency resolution of optical spectrum analyzers is typically too poor (many megahertz) for the acoustic imaging application. Spectral analysis using Fourier transform techniques in computers is well known. In the acoustic imaging application, an array of microphones or acoustic transducers would convert sound waves to electric signals which would be summed electronically. This summed signal would then be digitized with an analog to digital converter (A/D). The digitized signal would then undergo spectral analysis in a computer or processing electronics and the resulting image would be displayed.

OTHER EMBODIMENTS

Figure 11:
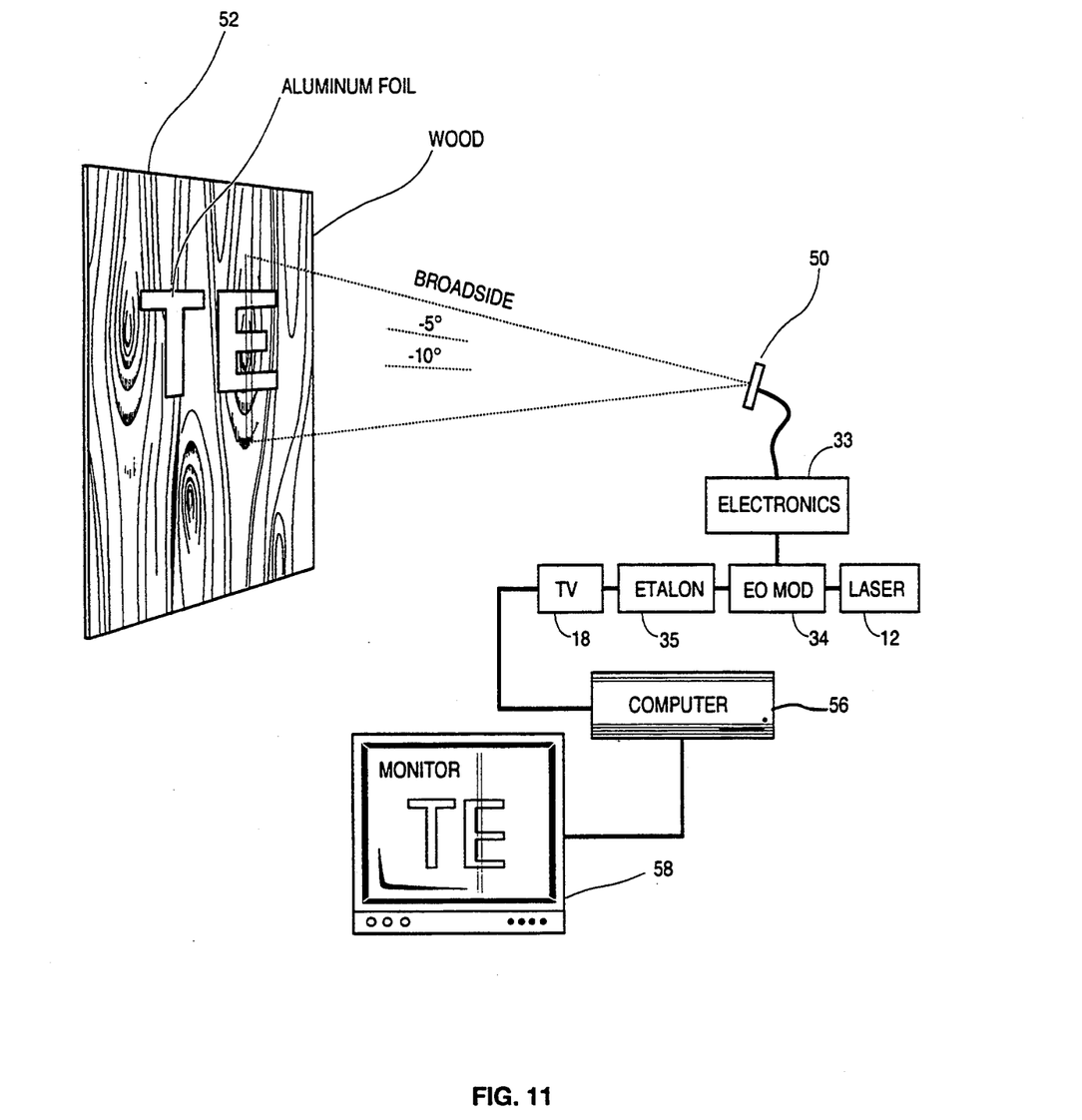
FIG. 11 shows a layout of a preferred embodiment of the present invention.

As indicated in FIG. 11, any antenna system 50 providing a beam which can be frequency scanned can be utilized in the practice of this invention. Frequency scannable antenna types which are available include the following:

a) Waveguide antenna with slots
b) Helical transmission line with taps
c) Dielectric rod transmission line with taps
d) Transmission grating
e) Reflecting grating
f) Dispersive prism
g) Parallel plate transmission line with taps
h) Dielectric slot transmission line with taps
i) Stripline with taps
j) Microstrip with taps
k) Individual antennae interconnected with delay lines In the arrangement shown in FIG 11 antenna 52 which could be any of the antenna listed above, collects radiation from target 50 which in this example is made of aluminum foil letters TE on a plywood background. The target is tilted backward so that the TE will reflect the cold sky. Output form the antenna is used by electronics 33 to modulate electro optic modulator 34 which modulates the beam from laser 12. The components of the modulated beam are detected in a plurality of angles (which angles are a function of the frequency spectrum passed by etalon 35). In this case the figure shows a vertical instantaneous field of view of a section of the E in target 52. The output of video camera 18 is used by computer 56 to create an image which may be displayed on monitor 58. In general, a one dimensional image is produced by creating on monitor 58 spots of varying brightness based on the amplitude of the spectrum analyses and vertical positioning of such spots is determined by the frequency. Horizontal positioning is based on the direction of the antenna strip is looking. Spots can also be created of various colors instead of brightness in order to demonstrate intensity. By panning the antenna, the remainder of the target can be plotted on monitor 58. Panning can also be accomplished by moving antenna 50 in a direction parallel to the area being imaged or by moving target 52 across the narrow vertical beam of antenna 50.

Also, any of many available spectrum analyzers that are capable of separating the incoming radiation (from antenna 50) into its various spectral components can be used to derive the images. Spectrum analyzer types capable of analyzing the microwaves received by the antenna include the following:

a) Electro-optic, etalon based spectrum analyzer
b) Electro-optic, prism based spectrum analyzer
c) Electro-optic, diffraction grating based spectrum analyzer
d) Microwave prism based spectrum analyzer.

Persons skilled in the art will also recognize that the laser beam can be modulated by modulating the current supply to the lasers.

CONCLUSION

While the above description contains many specifications, the reader should not misconstrue these a limitation on the scope of the invention, but merely as exemplification's of preferred embodiments thereof. Accordingly, the reader is requested to determine the scope of the invention by the appended claims and their legal equivalents, and not by the examples given above.

We claim:

1. A microwave antenna camera system for imaging microwave emitting objects within a field of view comprising:

a) an antenna system means having frequency dependent beam directions, for collecting microwave radiation and converting said radiation into a high frequency electrical signal,
   b) an optical source means for producing a coherent optical beam,
   c) an electro-optical modulating means for modulating said optical beam with said high frequency signal to produce a modulated optical beam having a frequency spectrum that is a function of the spatial distribution of said microwave emitting objects within said field of view,
   d) an imaging means for producing, from said modulated optical beam, an image of said microwave emitting objects within said field of view.

2. A system as in claim 1 wherein said imaging means comprises an optical beam direction dependent filter means for blocking light not having a predetermined frequency-direction relationship.

3. A system as in claim 2 wherein said optical beam direction dependent filter means is an etalon.

4. A system as in claim 3 wherein said imaging system means also comprises a television camera.

5. A system as in claim 1 wherein said imaging means comprises an electro-optic spectrum analyzer and a television camera.

6. A system as in claim 5 wherein said electro-optic spectrum analyzer comprises a prism.

7. A system as in claim 5 wherein said electro-optic spectrum analyzer comprises a diffraction grating.

8. A system as in claim 2 wherein said imaging means further comprises a television camera.

9. A system as in claim 1 wherein said antenna means is chosen from a group of antenna consisting of:

a) helical transmission line with taps
   b) dielectric rod transmission line with taps
   c) coaxial transmission line with taps
   d) transmission grating
   e) reflection grating f) an electro-optic modulator g) dispersive prism h) parallel plate transmission lines with taps i) stripline with taps j) microstrip with taps k) waveguide with slots l) individual antennae interconnected with coaxial cable delay lines.

10. A system as in claim 1 wherein said antenna means comprises a plurality of channels.

11. A system as in claim 10 wherein said antenna means comprises a plurality of individual antenna and each of said individual antenna is connected to a separate channel of said plurality of channels.

12. A system as in claim 11, wherein said imaging means is a two dimensional image producing means for producing two dimensional images.

13. The system as in claim 1 and further comprising frequency scanning means for changing the instantaneous field of view in at least two directions.

14. The system as in claim 13 wherein said two directions are normal to each other.

15. The system as in claim 1 and further comprising a source of microwave radiation for illuminating said field of view.

16. The system as in claim 1 wherein said source means is a laser and said optical beam is a laser beam and said modulating means comprise a means for modulating the power supply of said laser in order to modulate said laser beam.

* * * * *